United States Patent
Habets et al.

(10) Patent No.: US 10,699,971 B2
(45) Date of Patent: Jun. 30, 2020

(54) METHOD FOR PROCESSING OF A FURTHER LAYER ON A SEMICONDUCTOR WAFER

(71) Applicant: Qoniac GmbH, Dresden (DE)

(72) Inventors: Boris Habets, Dresden (DE); Martin Roessiger, Erlangen (DE); Stefan Buhl, Dresden (DE)

(73) Assignee: Qoniac GmbH, Dresden (DE)

( * ) Notice: Subject to any disclaimer, the term of this patent is extended or adjusted under 35 U.S.C. 154(b) by 5 days.

(21) Appl. No.: 16/016,719

(22) Filed: Jun. 25, 2018

(65) Prior Publication Data

US 2018/0342429 A1 Nov. 29, 2018

Related U.S. Application Data

(63) Continuation-in-part of application No. 14/827,877, filed on Aug. 17, 2015, now Pat. No. 10,008,422.

(51) Int. Cl.
*H01L 21/00* (2006.01)
*H01L 21/66* (2006.01)
*H01L 21/027* (2006.01)
*G03F 7/20* (2006.01)

(52) U.S. Cl.
CPC .............. *H01L 22/20* (2013.01); *G03F 7/705* (2013.01); *G03F 7/70483* (2013.01); *G03F 7/70558* (2013.01); *G03F 7/70625* (2013.01); *G03F 7/70633* (2013.01); *G03F 7/70641* (2013.01); *H01L 21/0274* (2013.01); *H01L 22/12* (2013.01)

(58) Field of Classification Search
CPC ...... H01L 22/20; H01L 21/0274; H01L 22/12

USPC ............................................................. 438/5
See application file for complete search history.

(56) References Cited

U.S. PATENT DOCUMENTS

| 6,578,188 | B1 * | 6/2003 | Pang .................. G03F 1/26 716/52 |
| 6,892,365 | B2 | 5/2005 | Culp et al. |
| 7,020,535 | B1 * | 3/2006 | Bode ............... G05B 19/41875 700/108 |
| 7,120,895 | B2 * | 10/2006 | Ye ....................... G03F 7/705 716/51 |
| 7,941,780 | B2 | 5/2011 | Avanessian et al. |
| 8,799,830 | B2 * | 8/2014 | Robles ............... G06F 17/5022 716/51 |

(Continued)

OTHER PUBLICATIONS

Ghaida, et. al., "A Framework for Exploring the Interaction Between Design Rules and Overlay Control," Proc. of SPIE vol. 8681 86810C-2 (2013).

(Continued)

*Primary Examiner* — Caleb E Henry
(74) *Attorney, Agent, or Firm* — Hodgson Russ LLP

(57) ABSTRACT

An apparatus and a method for analysis of processing of a semiconductor wafer is disclosed which comprises gathering a plurality of items of processing data, applying at least one process model to the at least some of the plurality of items of processing data to derive at least one set of process results, comparing at least some of the derived sets of process results or at least some of the plurality of items of processing data with a process window, and outputting a set of comparison results based on the comparison of the derived sets of process results or the plurality of items of processing data with the process window.

22 Claims, 8 Drawing Sheets

(56) References Cited

U.S. PATENT DOCUMENTS

| | | | | |
|---|---|---|---|---|
| 2002/0019729 | A1* | 2/2002 | Chang | G03F 1/26 |
| | | | | 703/6 |
| 2002/0035461 | A1* | 3/2002 | Chang | G03F 1/26 |
| | | | | 703/13 |
| 2010/0229147 | A1* | 9/2010 | Ye | G03F 7/705 |
| | | | | 716/50 |
| 2011/0099526 | A1* | 4/2011 | Liu | G03F 1/144 |
| | | | | 716/54 |
| 2011/0173578 | A1* | 7/2011 | Tsai | G03F 1/36 |
| | | | | 716/55 |
| 2011/0185324 | A1* | 7/2011 | Huang | G03F 7/705 |
| | | | | 716/55 |
| 2012/0113404 | A1* | 5/2012 | Hsu | G03F 7/70066 |
| | | | | 355/67 |
| 2012/0117522 | A1* | 5/2012 | Feng | G03F 1/70 |
| | | | | 716/54 |
| 2013/0326437 | A1* | 12/2013 | Liu | G06F 17/5068 |
| | | | | 716/54 |

OTHER PUBLICATIONS

Gupta et al., "Full chip two-layer DN and overlay process window analysis", Proc. of SPIE, vol. 9427, 94270H-1 to 94270H-6.

\* cited by examiner

METHOD FOR PROCESSING OF A FURTHER LAYER ON A SEMICONDUCTOR WAFER

CROSS-REFERENCE TO RELATED APPLICATIONS

This application is a continuation-in-part application of U.S. patent application Ser. No. 14/827,877 filed on Aug. 17, 2015.

The aforementioned patent application is hereby incorporated by reference in its entirety.

BACKGROUND OF THE INVENTION

Field of the Invention

This field of the present application relates in general to a method for assessing the usability, such as yield prediction or economic viability, of an exposed and developed semiconductor wafer and an apparatus for the processing of a semiconductor wafer.

Brief Description of the Related Art

It will be appreciated that the term "semiconductor wafer" as used in this disclosure is intended to imply wafers used in the manufacture of all types of semiconductor devices and microelectronic circuits, including, but not limited to, memory devices, ASICS, logic circuits such as controllers or microprocessors, etc., liquid crystal panels, and photovoltaic devices.

Current trends in the processing of the semiconductor wafers mean that overlay and critical dimension budgets shrink with shrinking ground rules and manufacturing processes are becoming more aggressive. Non-limiting examples of such aggressive manufacturing processes include, but are not limited to, multiple patterning, high aspect ratio etching or deposition of exotic materials on a surface of the semiconductor wafer. The non-uniformity of some manufacturing processes over the semiconductor wafer surface and a plurality of manufacturing process steps may result in non-uniform stress being applied to the semiconductor wafer. When the semiconductor wafer deforms from one manufacturing process step to a subsequent manufacturing process step, e.g. from one lower layer to a subsequent layer on top of the lower layer, patterns in the upper layer may become misaligned to patterns in the lower layer. For the error free functioning of a semiconductor device the relative position of patterns on the different layers to each other is relevant. These relative positional errors are termed "overlay errors".

A further issue that arises using the aggressive manufacturing processes are the so-called critical dimensions (CDs). This term is used to indicate the dimensions of critical patterns on the surface of the semiconductor wafer. These features are measured after processing, such as the patterning of the lithographic layer, or etching, etc., in order to verify the quality of the exposure and development process.

In practice, there are multiple measurement parameters, which need to be considered when deciding whether microelectronic devices manufactured on the semiconductor wafer are likely to perform according to specifications. The use of the overlay measurements and CD measurements is merely used as an illustration.

FIG. 6A shows an example of the process window used in the manufacture of microelectronic devices on the semiconductor wafers. The process window is shown as an idealised three-dimensional cube in which all (or a majority of) measurements of the processing data for the semiconductor wafers should fall. It should be noted that in practice the measurements are made only in a selection of different fields or areas of the semiconductor wafer and the conclusion is drawn that the semiconductor wafer as a whole is good if the measurements all (or at least a majority) fall within the volume of the box. Measured processing data falling outside of the process window may lead to the semiconductor wafer being considered to be "defective" and the semiconductor wafer may therefore be rejected by a quality controller.

In practice, the boundaries of the process window are likely to be more "fuzzy" and not so clear as the theory and practice has been applied to date. This can be illustrated with respect to the simple feature shown in FIGS. 5A and 5B, which illustrate a non-limiting example of the use of the overlay measurements and critical dimension measurements to determine whether the overlay measurements and the critical dimension measurements are within tolerance limits. FIGS. 5A and 5B show the overlap of a contact L2 with a metallisation line L1. It will be seen that, in FIG. 5A, there is an overlay error of the contact L2 with respect to the metallisation line L1 and a CD error of the contact L2 (i.e. too small). The area of overlap between the contact L2 and the metallisation line L1 is therefore too small to give an adequate electrical connection. On the other hand, in FIG. 5B, the width of the metallisation line L1 is nominally too wide, i.e. the metallisation line L1 has a CD error, and the overlay error for the contact L2 with respect to the metallisation line L1 is identical with that of FIG. 5A, as L2 has in this example no CD error. However, in the example of FIG. 5B, the area of overlap of the contact L2 and the metallisation line L1 is sufficient for a good electrical connection.

FIG. 5B illustrates therefore that there would be no need to reject this particular semiconductor wafer as being defective, even if the overlay measurements and the CD measurements indicate that the manufactured microelectronic device formed on the semiconductor layer is (theoretically) likely to fall outside of the process window. It will be noted that, in this particular simplified example, we have considered only two of the plurality of factors, such as other features and/or parameters, that will affect the performance of the manufacture microelectronic device. The idealised cube of FIG. 6A is, in other words, more like the polyhedron of FIG. 6B in which the various measurements influence each other. It will also be noted that in FIGS. 6A and 6B the process window is shown as a three-dimensional feature for illustrative purposes only and that the process window has, in fact, many more dimensions, i.e. n-dimensions, many of which influence each other.

Gupta et al disclose in the paper "Full chip two-layer DN and overlay process window analysis", Proc. of SPIE, vol. 9427, 94270H-1 to 94270H-6 an investigation of a two-layer model-based analysis of CD and overlay errors. This paper discloses the concept of using measurement data from a first layer to dictate how to process the second layer in order to improve the yield of a semiconductor wafer.

A method for designing a semiconductor chip is known from U.S. Pat. No. 7,941,780 B2 (IBM), which teaches use of a design automation tool to determine an intersect area (or overlap) between a first projected physical area of a first design shape and a second projected physical area of a second design shape. The '780 patent also teaches modifying the first design shape and the second design shape if the determined intersect area is less than a pre-determined value.

U.S. Pat. No. 6,892,365 B2 (IBM) teaches a method of predicting overlay failure of circuit configurations on adjacent, lithographically produced layers of a semiconductor wafer by providing design configurations for circuit portions to be lithographically produced on one or more adjacent layer of a semiconductor wafer and predicting shape and alignment for each circuit portions on each adjacent layer using one or more predetermined values for process fluctuation or misalignment error.

These prior art documents all teach the concept of simulating the manufacture of layers on the semiconductor wafer and then making adjustments to the process parameters to try and improve the yield of the semiconductor wafers.

SUMMARY OF THE INVENTION

This disclosure teaches a general method for analysis of processing of a semiconductor wafer which is more wide-ranging than that known in the prior art. The analysis enables the assessing of the usability of the semiconductor wafer. The term "usability" is to be understood in this disclosure to mean that the exposed and developed semiconductor wafer has an acceptable number, in terms of e.g. yield, of chips thereon that work or function according to specifications.

The method comprises initially gathering a plurality of items of processing data (not just overlay or CD measurements) and then applying at least one process model to the at least some of the plurality of items of processing data to derive at least one set of process results. The method then compares at least some of the derived sets of process results or at least some of the plurality of items of processing data with a process window and outputs at least one comparison result based on the comparison of the derived sets of process results or the plurality of items of processing data with the process window. The comparison result can be used to decide the usability of the exposed and developed semiconductor wafer.

The items of processing data are selected from the set of processing data which includes, but is not limited to, overlay errors, critical dimensions, levelling measurements, deposition thickness, etching times, etching depths, line edge roughness (LER), line width roughness (LWR), side wall angle, other geometry data of patterns, wafer shape and/or deformation, temperature of hot plates, defect measurements, exposure dose, focus/exposure dose measurement, electrical measurements.

Based on this comparison result, it is possible to adapt the process window or to amend one or more of the process parameters to improve the yield of the semiconductor wafer.

The method can be used for the processing of a further layer on the semiconductor wafer after deposition of at least one photoresist layer on a surface of a lower layer and exposing to radiation the at least one photoresist layer. At least part of the exposed photoresist layer can then be processed to leave a pattern. A plurality of items of processing data is measured during this process and at least one process model is applied to the at least some of the plurality of items of processing data to derive a set of process results. At least one of the derived set of process results or at least one of the plurality of items of processing data are compared with a process window. As noted above, the comparison can indicate the usability of the semiconductor wafer and indicate whether to accept or rework the further layer.

The disclosure also teaches an apparatus for the processing of layers on a semiconductor wafer, which comprises measuring equipment for collecting a plurality of items of processing data, a memory store for storing a plurality of models and a process window. The apparatus further includes a processor for processing data to derive a set of process results from the plurality of items of processing data and the stored plurality of process models. The processor is configured/adapted, using a computer program product loaded into a memory, to execute program instructions to compare at least one of the derived set of process results or at least one of the plurality of items of processing data with the stored process window, and output a comparison result based on the comparison of the derived set of process results or at least one of the plurality of items of processing data with the process window.

The method and apparatus of this disclosure therefore enable n-dimensions of items of processing data to be taken into account when analysing the manufacturing process of the semiconductor wafers.

It will be appreciated that the semiconductor wafer can be a wafer for microelectronic devices, such as memory devices, logic circuits such as controllers or microprocessors, etc., or ASICS, liquid crystal panels as well as photovoltaic devices.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

DESCRIPTION OF THE FIGURES

For a more complete understanding of the present invention and the advantages thereof, reference is now made to the following description and the accompanying drawings, in which.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 1:
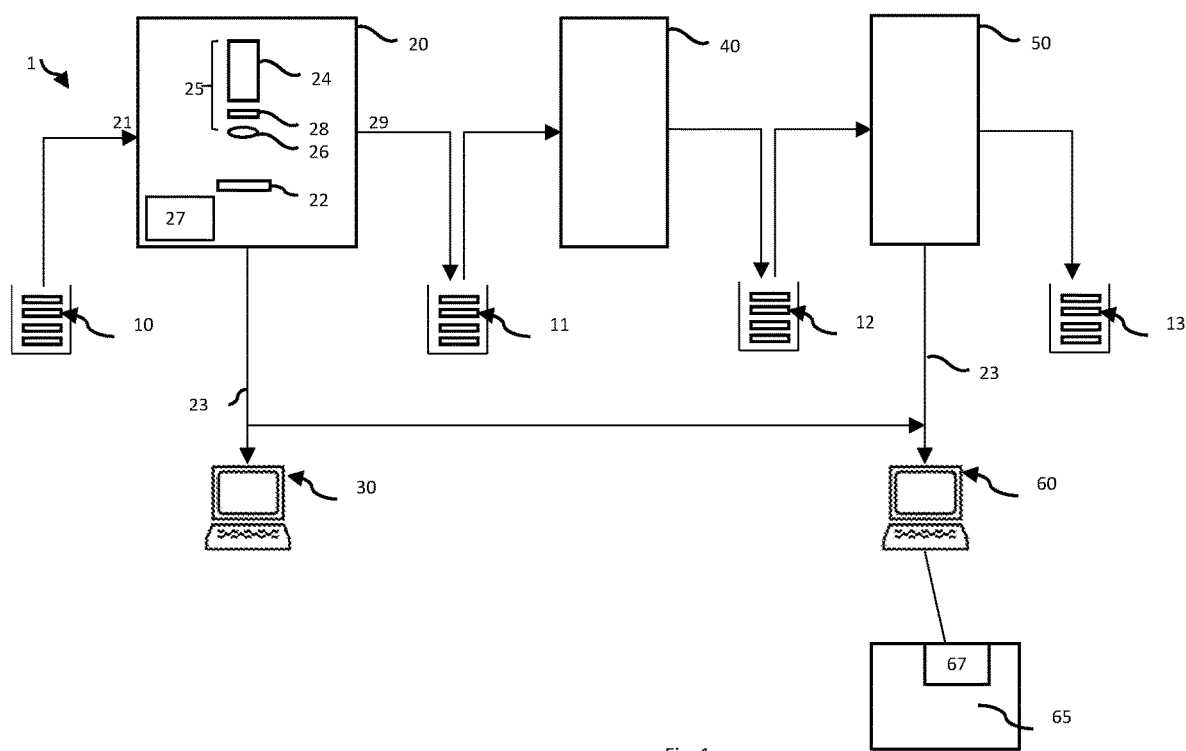
FIG. 1 shows a first aspect of the present disclosure.

FIG. 1 shows in a schematic view a fabrication unit 1 for patterning a surface of a semiconductor wafer 10 and performing the method for the analysis of the processing of the semiconductor wafer 10. The fabrication unit 1 forms part of a semiconductor manufacturing system. The fabrication unit 1 comprises an exposure tool 20 for aligning and exposing portions of the surface of the semiconductor wafers 10 to produce exposed semiconductor wafers 11, an exposure controller 30, a developing unit 40 for developing the exposed semiconductor wafers 11 to produce developed and exposed semiconductor wafers 12, and a measurement tool 50 to measure the developed and exposed semiconductor wafers 12, resulting in measured semiconductor wafers 13. The fabrication unit 1 also includes a processor 60, shown here as a stand-alone computer, but which could be running as a software module on a server, in a cloud computer or on a local computer. The processor 60 includes a storage memory 65 for storage of data. Such fabrication units 1 are known in the art.

A plurality of semiconductor wafers 10 is loaded into the exposure tool 20. The semiconductor wafers 10 loaded into the exposure tool 20 have been coated in one non-limiting aspect of the method with a photoresist film in a preceding process step. The exposure tool 20 includes a load port 21 for loading the semiconductor wafers 10 and an unload port 29 for unloading exposed ones of the semiconductor wafers 11. The load port 21 and the unload port 29 could be identical in the exposure tools 20. Within the exposure tool 20, the semiconductor wafers 10 are placed on a substrate holder 22.

Figure 2:
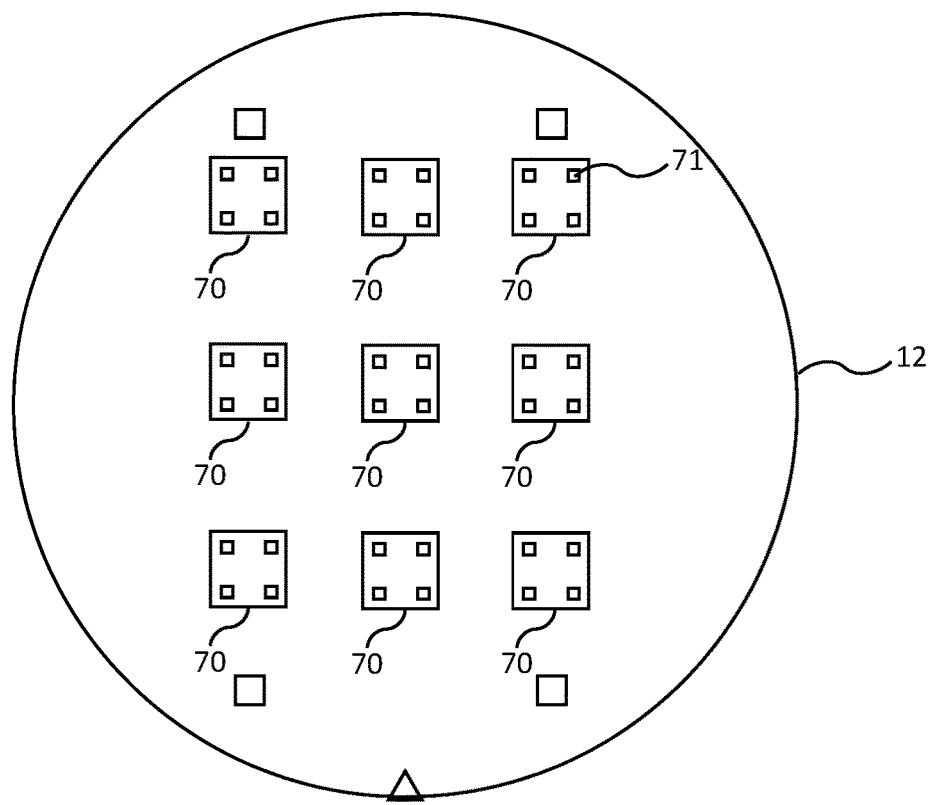
FIG. 2 shows wafer with exposure fields.
Figure 3:
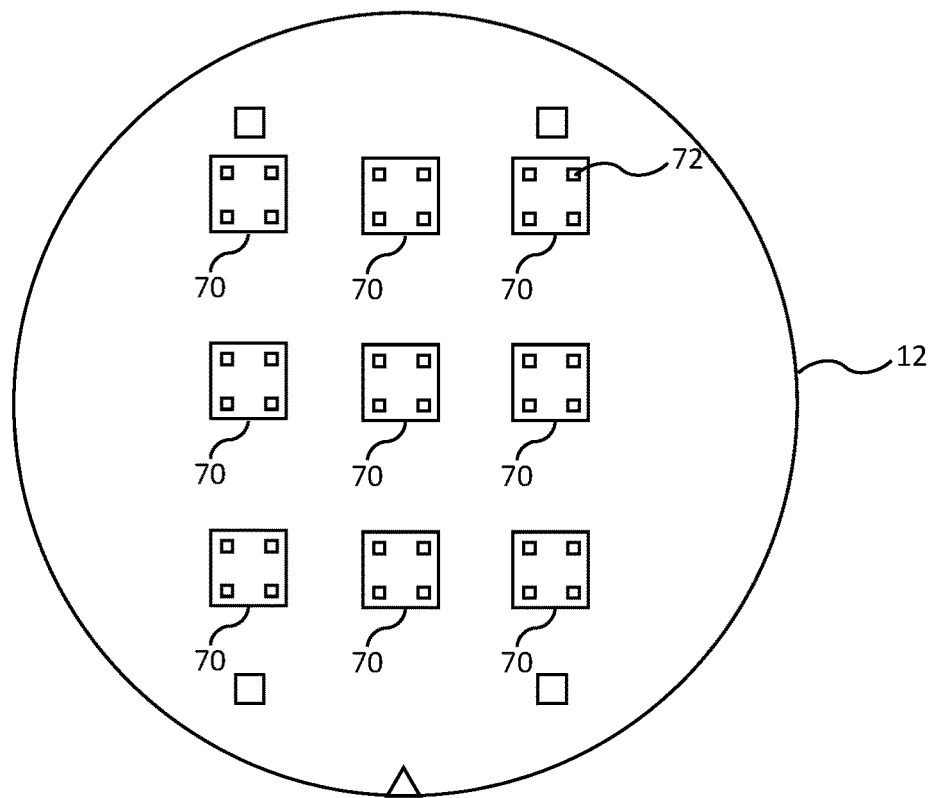
FIG. 3 shows a further layer of wafer with exposure fields.

A typical one of the semiconductor wafers 10 comprises a plurality of exposure fields 70 arranged on the semiconductor wafer 10 in a grid-like pattern, as schematically shown in FIGS. 2 and 3. The plurality of exposure fields 70 are usually exposed one exposure field 70 after another exposure field 70. The substrate holder 22 is positioned by actuators (not shown) within the exposure device 20 at least in two dimensions to move the semiconductor wafer 10. Thus, each one of the exposure fields 70 on the semiconductor wafer 10 is positioned in turn using a projection system 25. The projection system 25 comprises a light source 24 and projection optics 26, which function with a photo mask 28. The semiconductor wafer 10 includes, for example, alignment marks that are used by the exposure tool 20 to align the surface of the semiconductor wafer 10 with the light source 24 and the projection optics 26 to ensure that the correct exposure field 70 with the correct settings is illuminated. Items of processing data 23 from the alignment of the semiconductor wafer 10 as well as other processing data are generated by the exposure device 20 and this processing data 23 is transferred to the processor 60. The exposure device 20 includes a plurality of measurement sensors 27 to measure further items of the processing data, including the measurement data 23 and can be further pre-processed, as described later.

Each time the semiconductor wafer 10, the photo mask 28 and the projection system 25 have been aligned, the photo mask 28 is illuminated with the light source 24 and the pattern from the photo mask 28 is projected on an individual exposure field 70. The pattern on the photo mask 28 is used to generate one or more patterns on the surface of the semiconductor wafer 10 as well as overlay marks 71. The overlay marks 71 can form test structures as will be explained later.

The overlay marks 71 are used in a feedback loop to determine overlay correction parameters to be used by the exposure tool 20 to project the photo mask 28 onto the correct portion of the surface of the semiconductor wafer 10 with the correct settings for the exposure field 70 for further semiconductor wafers The overlay correction parameter uses other overlay marks 72 generated in a lower layer during a previous process step by a different exposure pattern in a previous photoresist layer during the exposure of the structure for this previous semiconductor layer (i.e. for a lower semiconductor layer). These lower overlay marks 72 are, for example, hard patterned and are identifiable through later (upper) photoresist layers. These lower overlay marks 72 will be termed "reference marks".

FIGS. 2 and 3 show as one aspect of the present disclosure overlay marks 71 and lower or other overlay marks 72 that are used on the exposed and developed semiconductor wafer 12. FIG. 2 shows a surface view of four individual overlay marks 71 in each one of the exposure fields 70.

The overlay measurements on the exposure fields 70 of the semiconductor wafers 10 are done for several reasons. The first reason is to determine the disposition of the photoresist pattern with respect to the lower layers, e.g. determine whether there is a good value of the overlay or whether the overlay error is large. In case the disposition of the photoresist pattern is so large that, for example, a deposition layer created in the next process step would not match with the layers underneath and would cause a failure of a microelectronic device on the manufactured semiconductor chip, the photoresist film with the photoresist pattern can be removed from the upper surface of the exposed and developed semiconductor wafer 12. In this case, the semiconductor wafer 10 can be reworked by removal of the photoresist film and coating with a new photoresist film. The new photoresist film can be exposed again in the exposure tool 20 to create a new photoresist pattern.

The second reason for the overlay measurements is to calculate, if necessary, process correction parameters, which are then used to compensate for process errors (as noted briefly above). A third reason would be to amend the process window for further processing steps for this semiconductor wafer.

It is shown in FIGS. 2 and 3 that several overlay marks 71 are created which form a test structure for each exposure field 70 for each single overlay measurement. A common approach is to arrange an overlay mark 71 at each corner of the exposure field 70 and one overlay mark 71 in the middle of each exposure field 70. Other patterns of the test structure are conceivable.

It will be appreciated that the measurement of overlay and CD are only non-limiting examples of the analysis of processing data. Other items of measurement data can be obtained from a variety of sources, for example, in the exposure tool 20 and the measurement tool 50. These items include, but are not limited to, overlay errors, critical dimensions, levelling measurements, deposition thickness, etching times, etching depths, line edge roughness (LER), line width roughness (LWR), side wall angle, other geometry data of patterns, wafer shape and/or deformation, temperature of hot plates, defect measurements, exposure dose, focus/exposure dose measurements, or electrical measurements.

In an ideal world, a large number of measurements would be made of the processing data. This is, however, time-consuming and, in most cases, not necessary as many values of the items of the processing data remain substantially unchanged over time or there are one or more process models 67 to identify the changes of the processing data over time or over space. An example of the process model is a shift in the overlay of patterns from one layer to another layer. The overlay shifts can be measured at isolated data points and the process models 67 can be used based on measuring the isolated data points to be able to model the overlay error over the whole of the exposed and developed semiconductor wafer 12.

Similarly, it is not necessary to measure the processing data for every single one of the semiconductor wafers 10. Measured items of processing data for a subset of the exposed and developed semiconductor wafers 12 can be used to estimate data using the so-called process models 67 stored in the memory store 65 for other ones of the exposed and developed semiconductor wafers 12 of the lot that has not been selected for the overlay measurement. A subset for a lot of twenty-five exposed and developed semiconductor wafers 12, for example, could comprise three of the semiconductor wafers 12. The number of exposed and developed semiconductor wafers 12 picked for measurement in the measurement tool 50 is user configurable and depends on a selection strategy decided by quality control engineers. Obviously, the more samples of the exposed and developed semiconductor wafers 12 that are chosen the more accurate the estimated data will be. If the statistical variations of the semiconductor manufacturing process are relatively low, a smaller number of samples of the exposed and developed semiconductor wafers 12 will suffice to obtain sufficiently accurate estimations by using the process models 67. If the statistical variations increase, the number of selected ones of the exposed and developed semiconductor wafers 12 should be increased accordingly.

Figure 4:
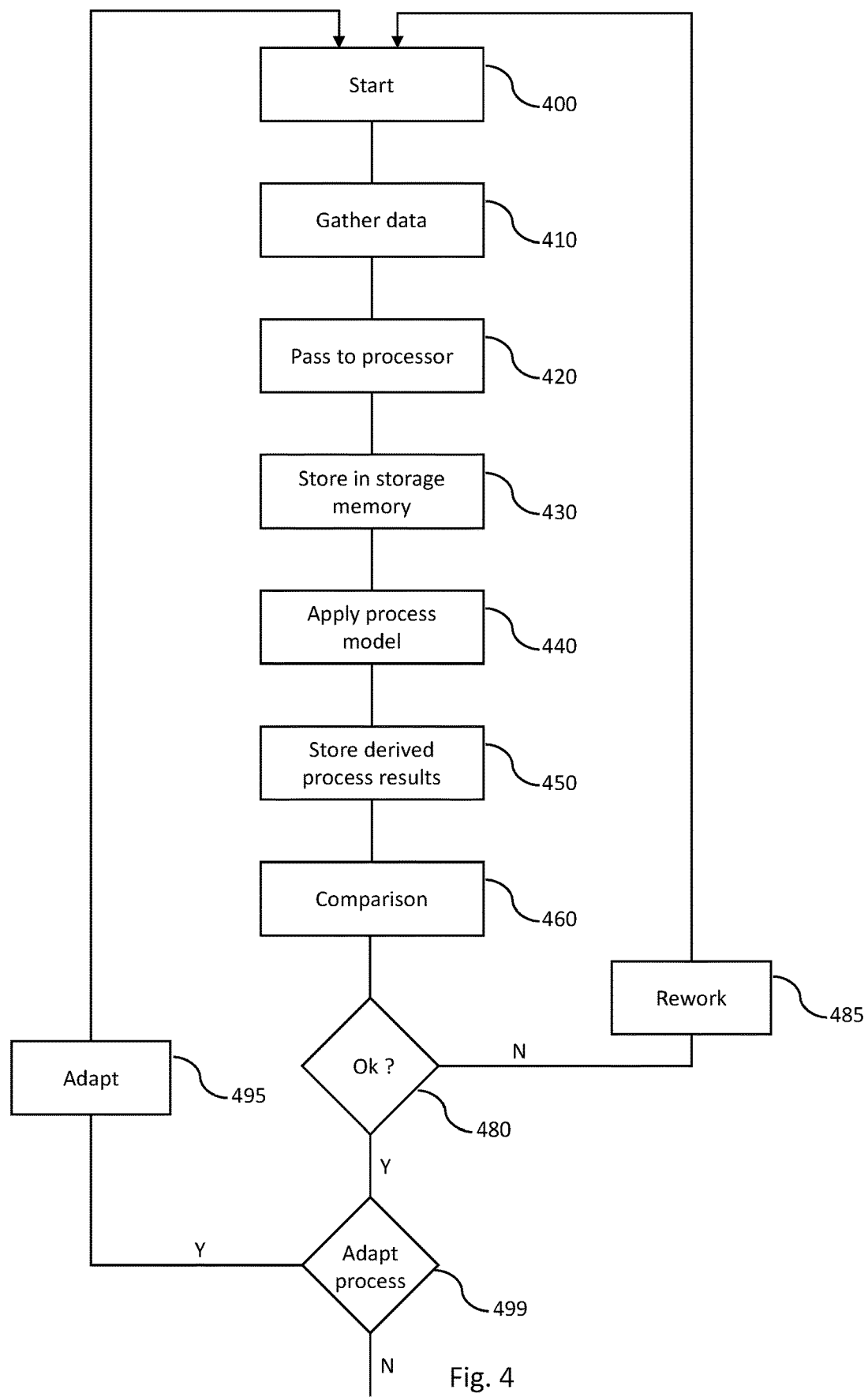
FIG. 4 is a flow chart of a method for analysis of a processing of a semiconductor wafer in accordance with a preferred embodiment of the present invention.
Figure 5A:
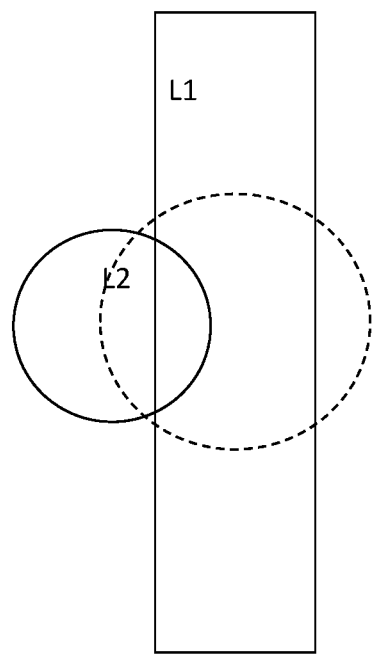
FIG. 5A shows an idealised process window.
Figure 5B:
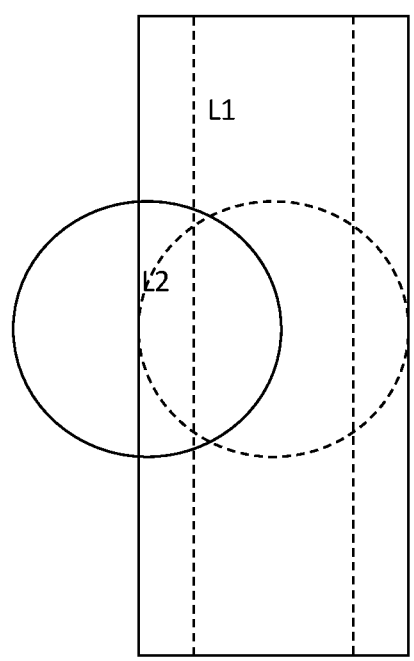
FIG. 5B shows a more realistic implementation of a process window.

The method for analysis of processing of the semiconductor wafer 10 is shown in outline in FIG. 4. The method starts in step 400. In a first step 410, items of processing data 23 are gathered during the processing steps, such as but not limited to, exposure of the photoresist layer on the semiconductor wafer 10 from, for example, the exposure tool 20 and the measurement tool 50. Further items of the processing data can be obtained from other equipment and tools used during and after the manufacturing process and not illustrated in FIG. 1. These items are not just limited to measuring processing data from the lithographic process, but from other processes such as etching, deposition, etc.

As noted above, this processing data includes, but is not limited to, overlay errors, critical dimensions, levelling measurements, deposition thickness, etching times, etching depths, line edge roughness (LER), line width roughness (LWR), side wall angle, other geometry data of patterns, wafer shape and/or deformation, temperature of hot plates, defect measurements, exposure dose, focus/exposure dose measurements, electrical measurements. Some of the items of processing data are obtained directly, whereas other items of processing data need to be pre-processed or calculated from other items of processing data. For example, the layout displacement is determined by pre-processing measurement of the wafer deformation. The processing data are passed to the processor 60 in step 420 and can be stored in the storage memory 65 in step 430.

The storage memory 65 also includes the one or more process models 67, which can be applied in step 440 to one or more of the items of processing data to derive a set of process results. The process results enable, as explained above, the manufacturing process to be more completely understood by, for example, interpolating the process results from measured items of the processing data. These derived process results are stored in step 450 in the storage memory 65.

Figure 6A:
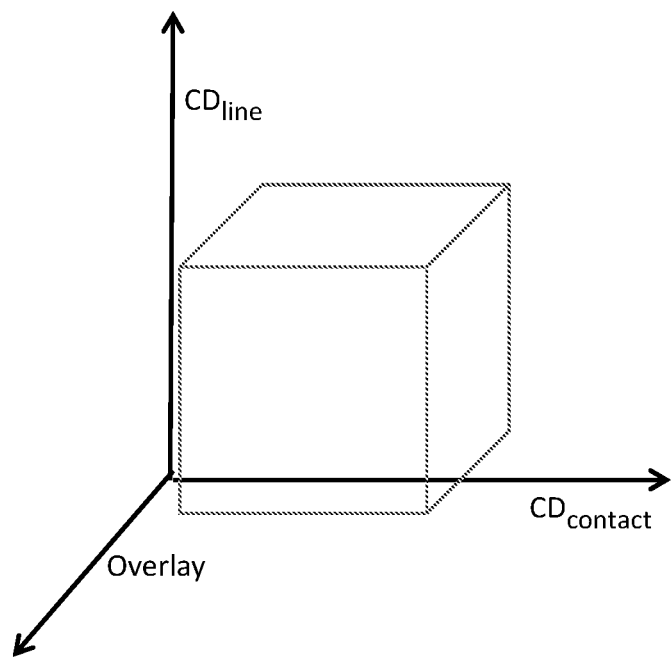
FIG. 6A shows an example of the process window used in the manufacture of microelectronic devices on the semiconductor wafers.
Figure 6B:
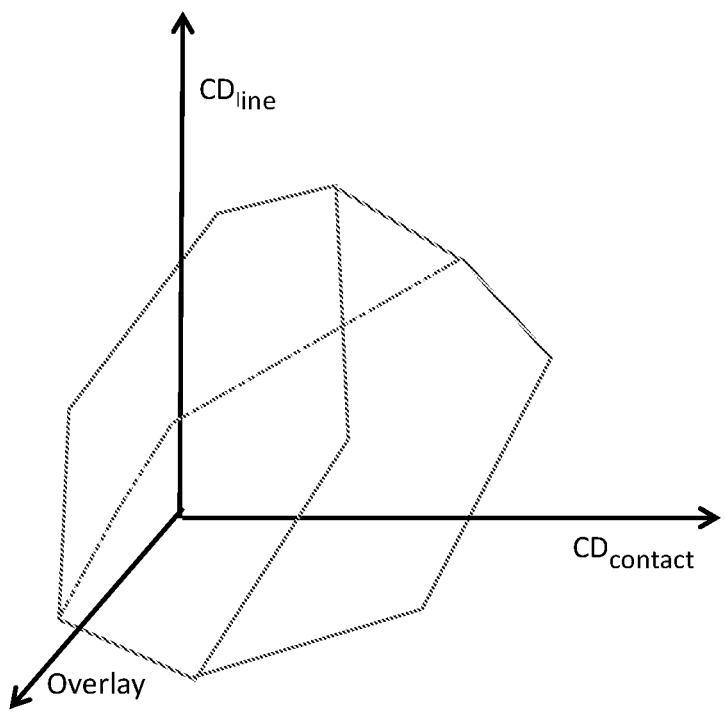
FIG. 6B shows an acceptable range for a process window used in the manufacture of microelectronic devices on the semiconductor wafers.

In step 460, a comparison is made between some of the derived set of process results and/or some of the plurality of items of process data with the process window for the manufacturing process, as shown in FIG. 6B. This comparison step 460 will indicate whether the exposure of the photoresist layer on the semiconductor wafer 10 is likely to lead to useable microelectronic devices formed on the semiconductor wafer 10. The results of the comparison could be that the processed semiconductor wafer 13 is within acceptable process range and, for example, a (non-reversible) etching process can be carried out on the surface of the exposed and developed semiconductor wafer 12 using the pattern mask. Alternatively, the comparison step 460 may indicate that it is likely that any isolation layer or metallisation layer formed using the exposed pattern is likely to be out of specification and therefore it would be advisable to re-work the exposed and developed semiconductor layer 12. Alternatively, it is possible that no decision can be made at that stage and that further measurements need to be made on one or more of the exposure fields 70 of the exposed and developed semiconductor wafer 12.

The comparison in step 460 is a multi-dimensional comparison and can be understood with reference to FIGS. 5A, 5B, 6A and 6B. As noted in the introduction, FIG. 5B would lead to a usable microelectronic device formed on the semiconductor wafer 10. This comparison step 460 would indicate that the individual items of processing data, in this case the critical dimensions and overlay error, are outside of the specification as given for example in FIG. 6A, but nevertheless the result still lies within an acceptable range of the process window, as illustrated FIG. 6B.

The comparison results from step 460 may also be used to estimate yield. For example, it is possible that the comparison step 460 indicates that many of the exposure fields 70 on the semiconductor wafer 10 will lead to acceptable (within specification) microelectronic devices on the semiconductor wafer 10, but one or more of the exposure fields or one or more of the microelectronic devices formed within the exposure field 70 (FIGS. 2 and 3) may be out of specification, where most of the other semiconductor circuits or microelectronic devices formed in other ones of the exposure fields 70 are likely to be within the specification. In this latter case, there may be no reason for re-working the complete photoresist layer, but rather it would be more efficient to continue processing the rest of the layers on the measured semiconductor wafer 13 and to disregard potentially those microelectronic devices formed in the exposure fields 70 of the measured semiconductor wafer 13, which may be out of specification.

It should be appreciated that the comparison results generated in the comparison step 460 may not be necessarily be a binary decision. It is more likely that the comparison result is part of a continuum and that the comparison result indicates, for example, that there is a high probability that the microelectronic device may not be within specification and therefore the operator can make a decision. In one non-limiting example of these methods, a threshold value is inserted for one or more of the dimensions of the process window. Should the comparison result indicate in step 480 that the measured semiconductor wafer 13 falls on one side of the threshold value in one (or more) dimensions, then appropriate actions, such as re-working or scrapping of the exposed and processed semiconductor wafer 12 in step 485 can be initiated. Should the comparison step 460 indicate that the measured semiconductor wafer 13 is on the other side of the specified threshold value, then processing of the exposed and developed semiconductor wafer 12 can continue in step 480. Some of the dimensions of the process results or the processing data are likely to be more critical than other ones of the process results or the processing data and this is also taken into account in this comparison step 460. It will be also appreciated that some of the dimensions of the process results are related to other dimensions of the process results and that there can be a "trade off" between different ones of the process results, such as that shown in FIG. 5B in which there is a CD error in the line L1 and an overlay error in L2, but the microelectronic circuit nonetheless is expected to work.

The process window might be thought of in some cases as a multi-dimensional layered object, like an onion. At the centre of the layered object, there is a very high probability that, if all of the measurement parameters have values in this centre, the yield of the measured semiconductor wafer 13 will he high, as most if not all of the microelectronic devices should work. Towards the outer layers, there are areas of low probability variations. In other words, there is a lower probability that the microelectronic devices will work if one or more of the measurement parameters fall within these areas. However, there may be no need to completely re-work the exposed and developed semiconductor wafer 12 as it will be expected that at least most of the microelectronic devices will work and thus the yield will be sufficiently high. It is possible to change also the threshold values for rejecting an exposed and developed semiconductor wafer 12 over the volume of the process window to take into account mutual interactions of the process parameters.

The comparison result can also be used to adapt the process window if appropriate and this is shown in steps 490 and 495. The result of the tests can be used to adapt in step 495 the stored process window 67 to indicate that in fact some of the dimensions of the processing data are not as sensitive as originally stored in the process window 67, or that certain parameter combinations lead (or do not lead) to failure/malfunction of the microelectronic devices. This is termed "feedback".

Another result could indicate that some of the process parameters in the exposure tool 20 can be amended to improve the performance of the process and this is also done in step 495.

The comparison step 460 might also indicate that extra measurements need to be carried out on the layer of the measured semiconductor wafer 13 to indicate whether the specifications have been met.

Figure 7:
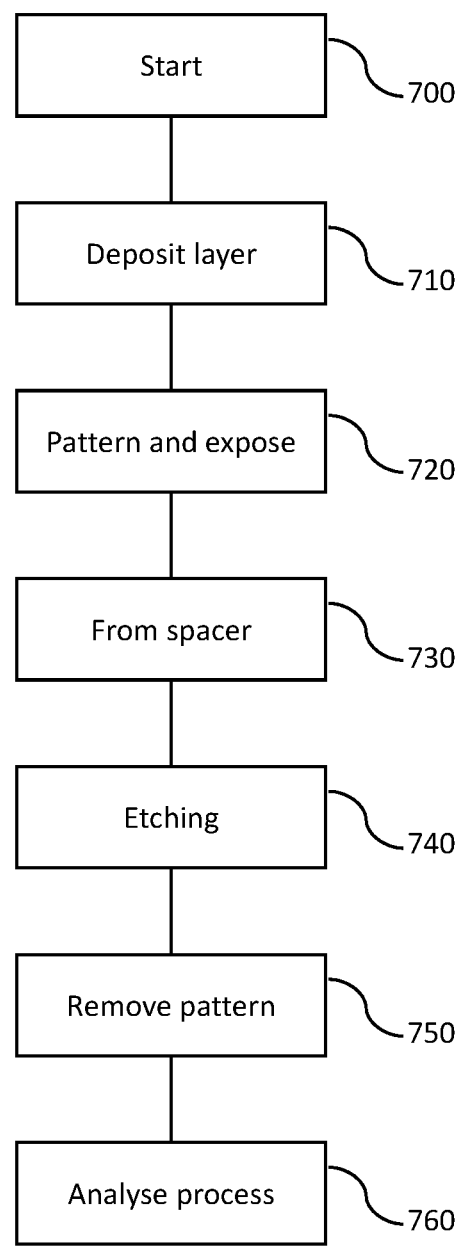
FIG. 7 illustrates a method in accordance with the present invention for analysing the processing of a semiconductor wafer using a technique known as self-aligned double patterning (SADP).

One non-limiting example use of the method of this description is in analysing the processing of the semiconductor wafer using a technique known as self-aligned double patterning (SADP). This technique is known in the art and comprises a so-called spacer which is a film layer, formed on the sidewall of a previously pre-patterned feature. The method is shown in FIG. 7, which starts at step 700 and in step 710 a photoresist layer is deposited on the surface of the semiconductor wafer 10. The photoresist layer is patterned and exposed in the exposure tool 20 in step 720 to leave a pattern on the surface of the semiconductor wafer 10.

In a next step, a spacer is formed in step 730 by deposition of further material or reaction of the photoresist layer, followed by etching in step 740 to remove all of the material on a horizontal surface except the spacer material, thereby leaving only the spacer material on the sidewalls. The originally patterned feature can be removed in step 750 and leaves only the spacer left. As noted above, the spacers were formed on the side wall of the previously pre-patterned feature and there are now effectively two spacers for every line.

The analysis method of this description can therefore be used to analyse whether the layers formed using SADP are likely to be within specification or not. This has been difficult with previous methods of the difficulty or the multiple variations of process parameters involved in the SADP method.

Another non-limiting use case of the method and system will now be described. In the case of the manufacture of memory devices from the semiconductor wafer 10, the surface and/or the layers of the developed and exposed semiconductor wafer 10 have a comparatively regular pattern. One or more structures or structural elements 820 (see FIG. 8) of the regular pattern can occur repeatedly on the surface of the semiconductor wafer 10.

Test structures 830 formed from the overlay marks 71 are located at the perimeter of the structural elements 820. Using the measurement tool 50, the critical dimensions (CD) of the structural elements 820 are measured in step 410. The CD measurements are passed in step 420 to the processor 60, and using these values, errors in the focus $\Delta F$ and the radiation dosage $\Delta D$ from the radiation through the projection optics 26 can be calculated in step 440. The processor 60 calculates, based on laws of physics, how an overlap, i.e. the contact surface providing the electrical contact, between ones of the structural elements 820 and contacts 840, arranged thereon, changes with changes in focus and radiation dosage. The calculation results enable estimating how the shape, size, and/or position of structures of the photo mask 28 change due to errors in focus and radiation does, i.e. $\Delta F$ and $\Delta D$.

Figure 8:
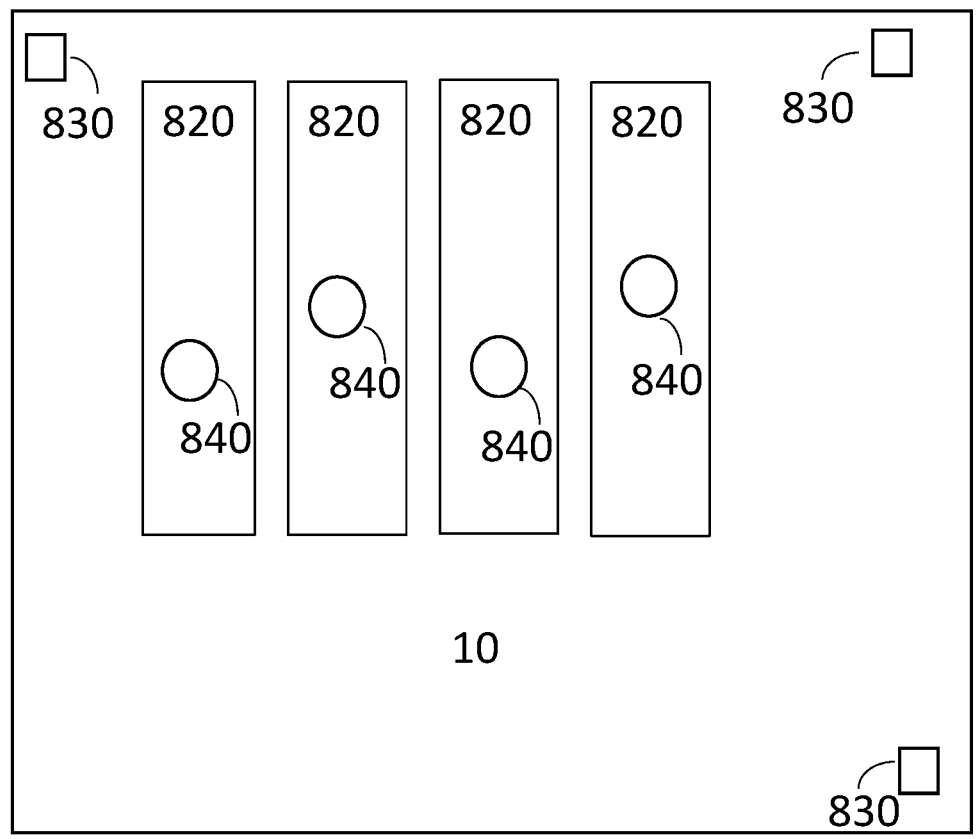
FIG. 8 is an illustration of one or more structures or structural elements 820 of a regular pattern occurring repeatedly on the surface of the semiconductor wafer.

The use case shown in FIG. 8 is thought to be advantageous for EUV lithography which uses radiation in the extreme UV spectrum, at around 13.5 nm (but this is not limiting of the invention). The use of such short wavelengths means that lack of focus can lead to considerable CD errors or deviations, which should be detected at the test structures.

Figure 10:
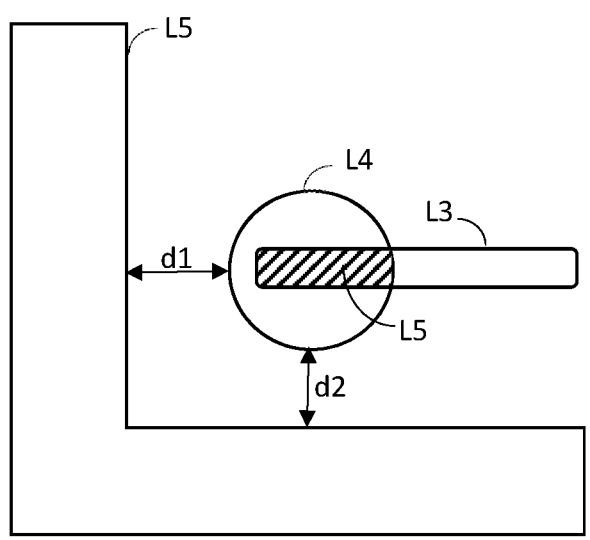
FIG. 10 shows a logic circuit with a portion of the surface of the exposed and developed semiconductor wafer in a further aspect of the invention during manufacture of a logic circuit.

FIG. 10 shows another aspect of the invention. In contrast to memory circuits, in the case of the manufacture of a logic circuit, the surface and/or the layers of the developed and exposed semiconductor wafer 10 have a more irregular pattern. The irregular pattern is less characterised by repetitions of one or more structural elements. The requirements as to the fulfillment of the specifications for the exposed and developed semiconductor wafer 10 are generally more challenging for logic circuits, having a more irregular and intricate structure of the surface, than for memory circuits. In this latter case, the critical dimensions (CD), for instance, measured on the surface of the developed and exposed semiconductor wafer 10 have to be monitored with respect adjacent (neighbouring) structures.

FIG. 10 shows the logic circuit with a portion of the surface of the exposed and developed semiconductor wafer 10 in a further aspect of the invention during manufacture of the logic circuit. A metallisation line L3, a contact L4 deposited on top of the metallisation line L3, and a substantially L-shaped structure L5 are shown. The substantially L-shaped structure L5 is adjacent to the contact L4 in two directions. The distances d1 and d2 along the two directions between the substantially L-shaped structure L5 and the contact L4 as well as an overlap or contact area L6 of the contact L4 with the metallisation line L3 are part of the processing data that are measured in step 410 on the developed and exposed semiconductor wafer 10 (it will be appreciated that other processing data may be measured).

In this aspect of the invention, the step 440 of applying at least one process model to the processing data, measured in step 410, comprises calculating from the CD measurements, such as the thickness of one or more test structures, an error of focus $\Delta F$ and an error of exposure dose $\Delta D$, which are then stored in the storage memory 65 in step 450. The processor 60 calculates, based on physical modelling such as optical proximity modelling, the thickness (i.e. the CD) of the metallisation line L3 and the diameter (i.e. the CD) of the contact L4. Using, for instance, optical proximity modelling and other modelling, it is calculated how the overlap or contact area L6 (see the shaded area in FIG. 10), i.e. the contact surface providing the electrical contact, between the metallisation line L3 and the contact L4 as well as the distances d1 and d2 change when the focus F and the radiation dosage D are changed. This calculation of the effect of changes in focus F and radiation dosage D on the overlap or contact area L6 and/or the distances d1 and d2 may further include taking into account further processing data such as lens errors (Zernike errors) and/or further errors made in the use of the projection system 25, which are known and/or measured during exposure. The accuracy of the calculation, and ultimately the usability of the exposed and developed semiconductor wafer, may thereby be further improved.

If the comparison in step 460 indicates that the developed and exposed semiconductor wafer 10 does not meet or will not meet the specifications as to required overlaps and distances between structural elements thereof, i.e. indicates that on the semiconductor wafer 10 a usable logic circuit is not formed, the semiconductor wafer 10 will be reworked.

The step 485 of reworking the further layer of the semiconductor wafer 10 comprises, in this aspect of the invention, calculating with the processor 60, based on a physical model and the simulation thereof, the effect of changing the focus ($\Delta F$) or changing the exposure dose ($\Delta D$) on the contact area L6 between the metallisation line L3 and the contact L4. The effect on further structures, present in the photo mask 28 and projected onto the surface of the semiconductor wafer 10, may be included in the calculation. The results of this calculation are then used for the step 485 of reworking the further layer of the semiconductor wafer 10. For instance, the focus and exposure dose and possibly further process parameters are set such that the outcome of the step 485 of reworking the further layer of the semiconductor wafer 10 will be a usable logic device formed on the semiconductor wafer 10.

Figure 9:
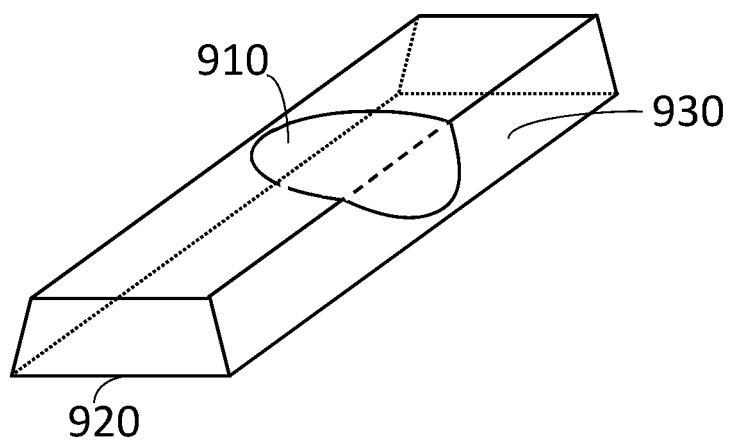
FIG. 9 illustrates a further use case for which the method and system can be used to analyse overlay errors in a three-dimensional structure.

A further use case for which the method and system can be used is to analyse overlay errors in a three-dimensional structure, such as that shown in FIG. 9. This further use case involves three-dimensional modelling and more elaborate calculations, by which the accuracy of calculations, and ultimately the usability of the exposed and developed semiconductor wafer, may be further improved.

In this further use case, a contact 910 is contacted to a line 920. Ideally the contact 910 should be positioned directly on top of the line 920 to ensure a good electrical contact. However, if there is an overlay error, then it is possible that the contact 910 is not positioned correctly, but that part of the contact 910 contacts sidewalls or edges 930 of the line 920 as shown in FIG. 9. It is possible that the contact area of the contact 910 on the top surface of the line 920 as well as the sidewalls or edges 930 is sufficient to ensure a sufficient electrical contact. This can be measured in the apparatus.

In the aspect shown in FIG. 9, at least some of the processing data and/or at least some of the process results, derived from the processing data, relate to the three-dimensional structure of the exposed and developed semiconductor wafer 10. In this aspect of the invention, the three-dimensional structure of electrical devices, such as chips, created on the exposed and developed semiconductor wafer 10 is taken into account.

As shown in FIG. 9, according to the specifications of the exposed and developed semiconductor wafer 10, a contact 910 is required to be placed directly on top of a line 920. During manufacture, the contact 910 can be misplaced slightly with respect to the line 920 such that the contact 910 may not be placed directly on top of the line 920. In this case, the contact 910 can also be in contact with the sidewall or edge 930 of the line 920. This difference will have an impact on the contact resistance between the contact 910 and the line 920.

In step 460, the gathered processing data and/or the process results derived in step 440 are compared to the process window 67. The comparison may indicate that the surface of the electrical connection between the contact 910 and the line 920 is sufficient for providing the required electrical properties of the electrical connection between the contact 910 and the line 910, in which case the semiconductor wafer 10 is regarded as having a usable semiconductor device formed thereon.

The comparison may indicate that the surface of the electrical connection between the contact 910 and the line 920 is not sufficient for providing the required electrical properties of the electrical connection between the contact 920 and the line 910, in which case the semiconductor wafer 10 is regarded as not having a usable semiconductor device formed thereon. The further layer on the semiconductor wafer 10 can in this case be reworked in step 485.

In yet a further aspect of the invention, the process models 67 are applied by the processor 60 to the measured processing data in step 440. The resulting derived set of process results includes characteristics of the three-dimensional structure of the electrical connection between the contact 920 and the line 910. The processor 60 uses the inferred three-dimensional structure to simulate electrical current through the electrical connection at different applied voltages. From the simulation, electrical characteristics of the electrical connection are derived. These electrical characteristics are stored in the storage memory 65.

In step 460, the electrical characteristics of the electrical connection are compared to the process window 67. The comparison may indicate that the electrical characteristics are sufficient to enable the required electrical properties of the electrical connection between the contact 920 and the line 910, in which case the semiconductor wafer 10 is regarded as having a usable semiconductor device formed thereon. The electrical simulation thus enables real time monitoring of the semiconductor wafer 10 during manufacture of the exposed and developed semiconductor wafer 10.

The comparison may indicate that the electrical characteristics are not sufficient for enabling the required electrical properties of the electrical connection between the contact 920 and the line 910, in which case the semiconductor wafer 10 is regarded as not having a usable semiconductor device formed thereon. The further layer on the semiconductor wafer 10 can in this case be reworked in step 485. The electrical simulation thus enables real time monitoring of the semiconductor wafer 10 during manufacture of the exposed and developed semiconductor wafer 10.

The derived electrical characteristics of the exposed and developed semiconductor wafer 10, and/or the results of the comparison of the derived electrical characteristics with the process window 67 may be stored in the storage memory 65. The storage memory may store the derived electrical characteristics and/or the results of the comparison over a period, for instance a period of days, weeks, months, or years. The comparison results may indicate probabilities that the exposed and developed semiconductor wafer 10 is within specifications, i.e. usable.

These stored electrical characteristics and/or stored comparison results may be compared to measured values, stored in a yield management system. The yield management system stores yield data as well as data from electrical verification measurements, made on the semiconductor wafers 10 or on the electrical devices, such as chips, created thereon, to monitor the electrical properties of the semiconductor wafers 10 or the electrical devices, such as chips, created thereon.

The yield data are logical data taking binary values. The yield data represent values regarding the usability of electrical devices, such as chips, created on the semiconductor wafer 10 (i.e. a selected electrical device is usable, a selected electrical device is not usable). The yield data may be compared with results from the comparison of the derived electrical characteristics with the process window 67.

The data from the electrical verification measurements (or electrical verification data) are physical data, representing resistance, capacitance, or the like. The electrical verification data may be compared to the process results, such as distance, overlap, or the like.

The comparison of the stored electrical characteristics and/or comparison results provides a feedback regarding the accuracy of electrical modelling used for deriving the electrical characteristics. The feedback enables calibrating and/or adjusting the electrical modelling, as well as improving the accuracy of the modelling. The calibrating and/or adjusting as well as the improving may be done automatically and iteratively. Thereby, drifts in processes, possibly occurring on a time scale of days, weeks, months, or years, may be compensated, and the accuracy of calculations based on the process models may be improved. Ultimately; the usability of the exposed and developed semiconductor wafer 10 may be further improved The present disclosure further relates to a computer program product embedded on a computer readable medium for carrying out the analysis. The computer program product comprises executable instructions for the measurements on the semiconductor wafers and the manufacture of wafers, as well as the simulation.

While various embodiments of the present invention have been described above, it should be understood that they have been presented by way of example, and not limitation. It will be apparent to persons skilled in the relevant arts that various changes in form and detail can be made therein without departing from the scope of the invention. For example, in the present disclosure, the semiconductor wafer has been exposed to a light source, such as an ultra-violet light source. However, it is well known to use other sources of illumination, such as electron beams, x-rays or similar sources of electromagnetic energy with wavelengths much shorter than light. Thus, the present invention should not be limited by any of the above-described exemplary embodiments but should be defined only in accordance with the following claims and their equivalents. The entirety of each of the aforementioned documents is incorporated by reference herein.

REFERENCE NUMERALS

1 Fabrication unit
10 Semiconductor wafer
11 Exposed semiconductor wafer
12 Exposed and developed semiconductor wafer
13 Measured semiconductor wafer
20 Exposure tool
21 Load port
22 Substrate holder
23 Processing data
24 Light source
25 Projection system
26 Projection optics
27 Measurement sensor
28 Photo mask
29 Unload port
30 Exposure controller
40 Developing unit
50 Measurement tool
60 Processor
65 Storage Memory
67 Process models
70 Exposure field
71 Overlay marks
72 Further overlay marks
810 Semiconductor wafer
820 Structures or structural elements
830 Test structures
910 Contact
920 Line
930 Edges or sidewalls

What is claimed is:

1. A method for the processing of a further layer on a semiconductor wafer comprising:

depositing, for manufacturing a further layer, at least one photoresist layer on a surface of a lower layer of a semiconductor wafer, exposing, by means of an exposure tool, to radiation the at least one photoresist layer;

removing, by means of a developing unit, at least part of the exposed photoresist layer to leave a pattern;

measuring, by means of at least one of the exposure tool, the developing unit, and a measurement tool, a plurality of items of processing data, some of the plurality of items of processing data being measured on the semiconductor wafer, the plurality of items of processing data further including lens errors and/or errors made in the use of the projection system;

applying, by means of a processor, at least one process model to the at least some of the measured plurality of items of processing data to derive a set of process results, the set of process results comprising an error in focus, an error in radiation dosage, and a change in a contact area between different ones of the structural elements of the semiconductor wafer;

comparing, by means of the processor, at least one of the derived set of process results or at least one of the measured plurality of items of processing data with a process window, the process window encompassing the at least one of the derived set of process results or the at least one of the measured plurality of items of processing data; and at least one of accepting or reworking the further layer, based on the comparison.

2. The method of claim 1, wherein the items of processing data are further selected from the set of processing data consisting of overlay errors, critical dimensions, levelling measurements, deposition thickness, etching times, etching depths, line edge roughness (LER), line width roughness (LWR), side wall angle, other geometry data of patterns, wafer shape and/or deformation, temperature of hot plates, defect measurements, exposure dose, focus/exposure dose measurement, electrical measurements, as well as further derived data derived from one or more of the processing data.

3. The method of claim 1, further comprising adaptation of the process window based on the comparison result.

4. The method of claim 1, further comprising amending at least one process parameter based on the comparison result.

5. The method of claim 1, wherein the comparison result comprises at least one of a measurement instruction, re-working of the processed layer, or yield prediction.

6. The method of claim 1, wherein the comparison result delivers a probability value.

7. The method of claim 1, wherein the comparison result is compared with a threshold value.

8. The method of claim 1, wherein the at least one of accepting or reworking the further layer is determined by a threshold value for at least one or more of the derived set of process results or the plurality of items of processing data.

9. The method of claim 1, further comprising depositing a further photoresist layer and exposing the further photoresist layer.

10. The method of claim 9, comprising forming a spacer on a sidewall of at least one element of the pattern.

11. A method for the processing of a further layer on a semiconductor wafer comprising:

depositing, for manufacturing a further layer, at least one photoresist layer on a surface of a lower layer of a semiconductor wafer, exposing by means of an exposure tool to radiation the at least one photoresist layer;

removing, by means of a developing unit, at least part of the exposed photoresist layer to leave a pattern;

measuring, by means of at least one of the exposure tool, the developing unit, and a measurement tool, a plurality of items of processing data, some of the plurality of items of processing data being measured on the semiconductor wafer;

applying, by means of a processor, at least one process model to the at least some of the measured plurality of items of processing data to derive a set of process results, at leak some of the set of process results relating to a three-dimensional structure of the semiconductor wafer;

comparing, by means of the processor, at least one of the derived set of process results or at least one of the measured plurality of items of processing data with a process window, the process window encompassing the at least one of the derived set of process results or the at least one of the measured plurality of items of processing data; and at least one of accepting or reworking the further layer, based on the comparison.

12. The method of claim 11, wherein the applying of at least one process model to the at least some of the plurality of items of processing data further comprises simulating electrical properties of the three-dimensional structure.

13. The method of claim 11, wherein the items of processing data are further selected from the set of processing data consisting of overlay errors, critical dimensions, levelling measurements, deposition thickness, etching times, etching depths, line edge roughness (LER), line width roughness (LWR), side wall angle, other geometry data of patterns, wafer shape and/or deformation, temperature of hot plates, defect measurements, exposure dose, focus/exposure dose measurement, electrical measurements, as well as further derived data derived from one or more of the processing data.

14. The method of claim 11, further comprising adaptation of the process window based on the comparison result.

15. The method of claim 11, further comprising amending at least one process parameter based on the comparison result.

16. The method of claim 11, wherein the comparison result comprises at least one of a measurement instruction, re-working of the processed layer, or yield prediction.

17. The method of claim 11, wherein the comparison result delivers a probability value.

18. The method of claim 11, wherein the comparison result is compared with a threshold value.

19. The method of claim 11, wherein the at least one of accepting or reworking the further layer is determined by a threshold value for at least one or more of the derived set of process results or the plurality of items of processing data.

20. The method of claim 11, further comprising depositing a further photoresist layer and exposing the further photoresist layer.

21. The method of claim 20, comprising forming a spacer on a sidewall of at least one element of the pattern.

22. The method of claim 11, further comprising
storing the derived set of process results and/or the comparison results in the storage memory, and
comparing the stored and derived set of process results and/or the stored comparison results with data stored in a yield management system, wherein the data include yield data and data from electrical verification measurements.

* * * * *